(12) United States Patent
Ando

(10) Patent No.: US 6,792,379 B2  
(45) Date of Patent: Sep. 14, 2004

(54) DATA-BASED CONTROL OF INTEGRATED CIRCUITS

(76) Inventor: Yoshiyuki Ando, Nishi 3-2-62, Kunitachi-shi, Tokyo 186-0005 (JP)

( * ) Notice: Subject to any disclaimer, the term of this patent is extended or adjusted under 35 U.S.C. 154(b) by 238 days.

(21) Appl. No.: 10/063,450

(22) Filed: Apr. 24, 2002

(65) Prior Publication Data

US 2003/0204349 A1 Oct. 30, 2003

(51) Int. Cl.$^7$ ............................................. H05K 17/62
(52) U.S. Cl. ......................................... 702/130; 702/99
(58) Field of Search .................................. 702/130, 132, 702/99; 341/121; 327/524, 525, 530, 535, 545

(56) References Cited

U.S. PATENT DOCUMENTS

| | | | | |
|---|---|---|---|---|
| 5,719,800 A | * | 2/1998 | Mittal et al. | |
| 5,781,060 A | * | 7/1998 | Sugawara | |
| 5,996,083 A | * | 11/1999 | Gupta et al. | |
| 6,006,169 A | * | 12/1999 | Sandhu et al. | |
| 6,320,453 B1 | * | 11/2001 | Manning | |
| 6,345,362 B1 | * | 2/2002 | Bertin et al. | |
| 6,574,577 B2 | * | 6/2003 | Stapleton et al. | |
| 6,675,360 B1 | * | 1/2004 | Cantone et al. | |
| 2004/0004570 A1 | * | 1/2004 | Lehmann | |

* cited by examiner

Primary Examiner—Marc S. Hoff  
Assistant Examiner—Craig Steven Miller  
(74) Attorney, Agent, or Firm—Richard D. Fuerle

(57) ABSTRACT

Integrated circuit chips can have a programmable data reference table that provides information required for circuit blocks on the chip to attain a desired performance, such as a certain power consumption and/or clock speed. The information entered into this table is based on data obtained from actual tests performed on the chip either when it is on a wafer or after it has been cut from the wafer. The tests determine the clock rates, supply voltages, and back-bias voltages at which the chip can successfully execute a program.

25 Claims, 2 Drawing Sheets

DATA-BASED CONTROL OF INTEGRATED CIRCUITS

BACKGROUND OF INVENTION

This invention relates the use of data obtained by testing integrated circuit (IC) chips to control the performance of the IC chip. In particular, it relates to simulating the operation of an integrated circuit chip and programming the reference data table of the chip with information based on data obtained from that simulation.

Integrated circuit chips are made by depositing and removing insulating and conducting layers on silicon wafers using processes such as photolithography, oxidation, and chemical vapor deposition. During these processes, the chips are subjected to high temperatures and exposure to various gases and plasmas. It is nearly impossible to hold the conditions exactly the same for every chip on a wafer. As a result, the chips differ in the thicknesses of their different layers and in the diffusion profiles of dopants such as boron or phosphorus. These physical differences mean that the chips have different optimal operating parameters.

Each wafer can have many chips on it and each chip may comprise thousands or even millions of transistors. Each transistor has a characteristic threshold voltage, i.e., the source-to-gate voltage that must be exceeded to turn the transistor ON. However, even when the transistor is OFF, a small amount of current, the subthreshold leakage current, leaks between the drain and the source. Since each IC chip comprises a large number of transistors, the tiny subthreshold leakage current for each transistor adds up to a substantial current for the entire chip. This current loss is especially important for computers that run on batteries, such as lap-tops.

The subthreshold leakage current can be reduced by increasing the threshold voltage. One way to increase the threshold voltage of a chip is by increasing the back-bias voltage, the voltage applied to the substrate of the transistor. However, a higher threshold voltage increases the time required for the current to charge up the logical threshold voltage, which increases the switching time of the transistor and lowers the clock speed of the chip. Thus, low power consumption and high clock speed are contradictory requirements. Nevertheless, IC chips for use in mobile computers are now required to have both higher program execution speed and lower power consumptions. In order to attain those contradictory performance characteristics, the range of permitted threshold voltages and other characteristics has become narrower and narrower. In some cases, at least two different threshold voltages or other control conditions are used. In U.S. Pat. No. 5,710,800, for example, the supply voltage and clock rate is controlled using an internal control circuit.

In U.S. Pat. No. 6,345,362, each functional unit in an IC chip has an independently controllable threshold voltage. The instructions to a chip are decoded to determine which functional units are needed to execute the instructions. The process speed of the units can then be adjusted to the optimal power level. A status table indicates the present power status of each of the functional units and a requirements table identifies the units required to execute a particular instruction.

In U.S. Pat. No. 5,996,083, the rate of program execution is controlled by software that changes the data bus width and the power latency values. The power consumption per second can be decreased by changing the data bus width from 64 bits to 32 bits, but this approximately doubles the program execution time. The execution time for each program is determined by the clock rate and the power latency, which is the time required to change the applied voltage or the status condition (e.g., standby or execute). The power latency time is needed to stabilize the applied power and the program execution and it adds to the total consumption of power and the total operation speed. Changes in data bus width and power latency controlled by the instruction program. In U.S. Pat. No. 5,996,083, the power consumption or program execution speed is improved by changing the program using an internal control circuit. But the values the control circuit works with are the values designed for the chip.

SUMMARY OF INVENTION

In this invention, the values entered into in a reference data table on an IC chip are based on actual measurements made on that chip. That is, before a chip shipped, it is tested, both after the wafer is made and after individual chips have been cut from the wafer and assembled. During those tests, the optimal values for various parameters for that chip can be determined. These experimentally-determined values are entered in the reference data table. In this way, each chip can be individually optimized according to its own properties.

The method of this invention may also result in fewer rejected chips. That is, a chip that is designed to operate at, for example, 120 MHz at 3.3 volts, but cannot do so is rejected. But that chip may be able to operate at 120 MHz at 3.5 volts. According to the method of this invention, the 3.5 volt value would be used and the chip would not be rejected.

The method of this invention can be used to reduce the power consumed by a chip, maximize its operating speed, reduce its operating voltage, or achieve a balance of high speed and low power consumption.

DETAILED DESCRIPTION

Figure 1:
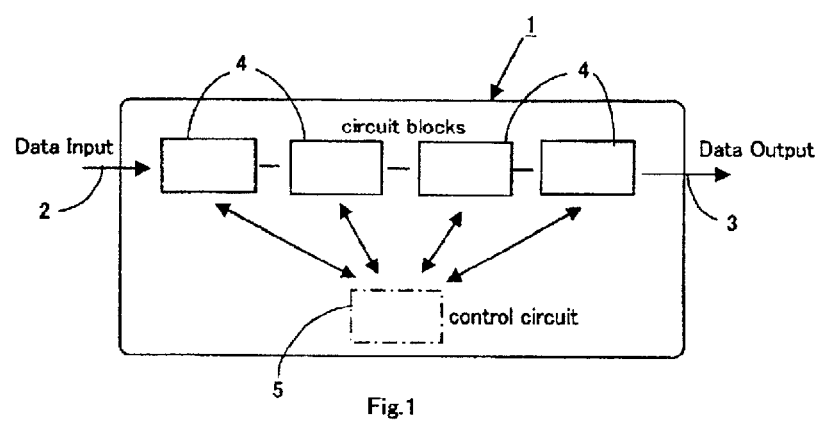
FIG. 1 is a schematic diagram of an IC chip.

In FIG. 1, large scale integrated circuit (LSI) chip 1, either as one of many IC chips on a wafer or as an assembled individual IC chip, has a data input 2 and a data output 3. Chip 1 comprises numerous partitioned circuit blocks 4, but it could also comprise a single circuit block 4. Control circuit 5 controls various parameters of circuit blocks 4, such as clock speed, supply voltage, and back-bias voltage.

Figure 2:
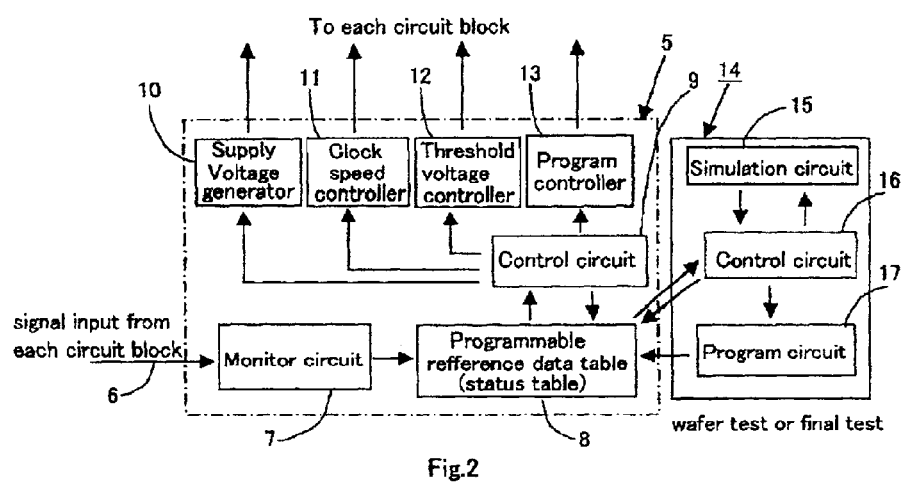
FIG. 2 is a schematic diagram of (1) the control circuit shown in FIG. 1 and (2) a simulation tester.

In FIG. 2, signal input 6 from each circuit block 4 contains information such as whether a circuit block is operating or on stand-by and, if it is operating, at what clock speed it is operating and/or what program it is executing. Signal input 6 goes to monitor circuit 7, which determines which circuit blocks will be used next and at what clock speeds they will be used. Monitor circuit 7 accesses reference data table 8 for the supply voltage, back-bias voltage, or other conditions needed to attain the performance, such as clock speed. For each circuit block 4, control circuit 9 sends the supply voltage to be used to supply voltage generator 10, which then generates the designated supply voltage; it sends the clock speed to be used to clock speed controller 11, which sets the clock speed to be used; it sends the back-bias voltage to be used to threshold voltage controller 12, which sets the threshold voltage by controlling the back-bias voltage; and it sends the instructions to be used to the program controller 13, which changes the program of the instruction sets, such as the data bus width.

Programmable reference data table 8 contains information, such as clock speed, power usage, or operating voltage range, that is required attain a desired performance. The following is an example of the type of information that can be placed in table 8:

| | Conditions Required to Obtain Desired Clock Speed | |
|---|---|---|
| Desired Clock Speed (GHz) | Supply Voltage (V) | Back-Bias Voltage (V) |
| 1.0 | 3.0 | 0.4 |
| 1.5 | 3.2 | 0.3 |
| 2.0 | 3.4 | 0.2 |
| 2.5 | 3.6 | 0.1 |

Because power is current times voltage, the power used by a voltage block can be controlled by controlling its supply voltage. The supply voltages and back-bias voltages in the table should be considered to be target voltages and voltages slightly above or below the target voltages may be permitted by the control circuits.

Table 8 may contain data for an entire chip or it may contain different data for different circuit blocks 4 on a chip. It could even contain different data for different transistors or different groups of transistors on a chip. This data is accessed by control circuit 9 so that circuit blocks 4 operate at the optimal speed and voltages.

Previously, the values in reference data table 8 were determined by the design of the chip. That is, the clock speeds, supply voltages, and back bias voltages that the chip was designed to operate at were entered into table 8. However, as explained hereinabove, each chip is slightly different and the designed values may not be the optimal values for any particular chip (see "Impact of Die-to-Die and Within-Die Parameter Fluctuations on the Maximum Clock Frequency Distribution for Gigascale Integration," by Keith A. Bowman, IEEE Journal of Solid-State Circuits, Vol. 37, No. 2, February 2002).

Referring again to FIG. 2, in this invention reference data table 8 is programmable and values based on measured data are entered into table 8. Tester 14 tests chips to determine whether the chips are acceptable. The test can be performed when the chips are part of a wafer or when individual chips have been cut from a wafer, assembled, and are ready to be shipped, or at both times. The test is preferably performed while the chips are on a wafer, however, as that is more economical.

Tester 14 has a simulation circuit 15, which provides one or more programs for the chip to execute, a control circuit 16, which controls the clock speeds, supply voltages, back-bias voltages, and programs of instruction sets used in the test, and the programs to be executed by the chip. The test can be performed on the entire chip and data can be entered into table for the entire chip. Alternatively, the test can be perform on individual circuit blocks or even on individual transistors or groups of transistors and data can be entered into table 8 for each circuit block, transistor, or group of transistors. The test typically consists of determining whether the chip can successfully execute one or more programs at various clock speeds, supply voltages, back-bias voltages, and programs of instruction sets. Preferably, for use in battery-powered computers, the chip is tested at 2 to 4 different supply voltages between 1 and 4 volts, at 2 to 4 different back-bias voltages between −0.5 and +0.5 volts, and at 2 to 4 different clock speeds between 1 and 300 MHz. Preferably, for use in plug-in computers, the chip is tested at 2 to 4 different supply voltages between 1 and 4 volts, at 2 to 4 different back-bias voltages between −0.5 and +0.5 volts, and at 2 to 4 different clock speeds between 0.2 and 2 GHz. Of course, as chips improve, the preferred test voltages may fall while clock speeds increase. The test may also be performed at other conditions, such as at different temperatures, for example, between 0 to 70° C. Typically, the data obtained is the minimum supply voltages and minimum back-bias voltages used in the test, at which the chip successfully executed a program at each clock speed tested. The data may also show that the operating voltage values should be different from the design voltage values, which may change the range of the operating voltages.

Control circuit 15 also evaluates the results of the test and, based on the test results, selects values to be entered into table 8. Data obtained during testing may be "adjusted" to allow for a margin of error or for other reasons. A program circuit 16 then programs table 8 by entering values based on the test data into it. The values can be permanently fixed in table 8 by, for example, the anti-fuse method, the non-volatile memory method, or by other methods. In the anti-fuse method (see U.S. Pat. No. 5,324,681, herein incorporated by reference), a value is fixed in table 8 by burning out a "fuse" in the chip. U.S. Pat. No. 6,319,773B1, herein incorporated by reference, describes the non-volatile memory method. Alternatively, the values can be tentatively entered into table 8 so that the chip can be retested and new values entered into the table at a later time. Tentative values may be useful to allow for erroneous testing or changes in the chip or the requirements for its use.

What is claimed is:

1. In an integrated circuit chip having a programmable reference data table for holding information used to control at least one circuit block in said chip, a method of improving the performance of said chip comprising
    (A) testing said chip to determine at least two data selected from the group consisting of different operating voltages, different clock speeds, different back-bias voltages, different data bus widths, different power latency values, and mixtures thereof; and
    (B) entering at least two values based on said data into said reference data table using a non-volatile memory method or an anti-fuse method, whereby a signal from said at least one circuit block is sent to a monitor circuit, which accesses data from said reference data table and uses said data accessed from said reference data table to determine which circuit blocks will be used and conditions needed to attain the desired performance.

2. A method according to claim 1 wherein said values are permanently entered into said reference data table.

3. A method according to claim 2 wherein said values are entered using an anti-fuse method.

4. A method according to claim 2 wherein said values are entered using a non-volatile memory method.

5. A method according to claim 1 wherein said values are tentatively entered into said reference data table.

6. A method according to claim 1 wherein said chip is for use in a battery-powered computer and is tested at 2 to 4 different supply voltages between 1 and 4 volts, 2 to 4 different back-bias voltages between −0.5 and +0.5 volts, and 2 to 4 different clock speeds between 1 and 300 MHz.

7. A method according to claim 1 wherein said chip is for use in a plug-in computer and is tested at 2 to 4 different supply voltages between 1 and 4 volts, 2 to 4 different back-bias voltages between −0.05 and +0.5 volts, and 2 to 4 different clock speeds between 0.2 and 2 GHz.

8. A method according to claim 1 wherein said chip has only a single circuit block.

9. A method according to claim 1 wherein said chip has numerous circuit blocks.

10. A method according to claim 1 wherein said chip is tested when it is on a wafer.

11. A method according to claim 1 wherein said chip is tested after it has been cut from a wafer.

12. A method according to claim 1 wherein said data comprises at least one supply voltage, at least one back-bias voltage, and at least one clock speed.

13. A method according to claim 1 wherein said data comprises the minimum supply voltages and minimum back bias voltages at which the chip successfully executed a program at different clock speeds.

14. A method according to claim 1 wherein said data comprises at least one data bus width or at least one power latency value.

15. A method according to claim 1 wherein the performance that is improved is the operating clock speed.

16. A method according to claim 1 wherein the performance that is improved is the operating voltage range.

17. A microprocessor chip made according to the method of claim 1.

18. An integrated circuit chip made according to the method of claim 1.

19. A computer comprising an integrated circuit chip according to claim 18.

20. A computer according to claim 19 that is battery powered.

21. In a wafer having a multiplicity of integrated circuit chips thereon, each having a programmable reference data table for holding data including the supply voltage, back-bias voltage, and clock speed to be used to control at least one circuit block on said integrated circuit chip, a method of programming the reference data table of a chip with improved values comprising (A) testing the chip to determine data comprising at least a minimum supply voltage and a minimum back-bias voltage at which said chip can operate at at least one clock speed; and (B) based on said data, entering at least two values into the chip's programmable reference data table using a non-volatile memory method or an anti-fuse method, said at least two values including a supply voltage and back-bias voltage to be used to attain said at least one clock speed, whereby a signal from said at least one circuit block is sent to a monitor circuit, which accesses data from said reference data table and uses said data accessed from said reference data table to determine which circuit blocks will be used and conditions needed to attain the desired performance.

22. An integrated circuit chip made according to the method of claim 21.

23. A computer comprising an integrated circuit chip according to claim 22.

24. In a wafer having a multiplicity of integrated circuit chips thereon, each of said chips having a programmable reference data table for holding, for at least one circuit block in said chip, values comprising supply voltages and back-bias voltages to be used to attain at least two different clock speeds, a method of improving the power usage requirements of said chip comprising (A) executing at least one program on said chip at at least two different supply voltages, at least two different back-bias voltages, and at least two different clock speeds;

(B) collecting data comprising the lowest supply voltage and the lowest back-bias voltage at which said chip successfully executed said program at each clock speed tested;

(C) based on said data, determining values comprising the optimal supply voltages and back bias voltages to be used for at least two different clock speeds; and (D) entering said values into said table using a non-volatile memory method or an anti-fuse method, whereby a signal from said at least one circuit block is sent to a monitor circuit, which accesses data from said reference data table and uses said data accessed from said reference data table to determine which circuit blocks will be used and conditions needed to attain the desired performance.

25. A wafer having at least one chip thereon programmed according to the method of claim 24.

* * * * *